United States Patent [19]

Kato et al.

[11] Patent Number: 4,461,825

[45] Date of Patent: Jul. 24, 1984

[54] METHOD FOR FORMING RESIST PATTERN

[75] Inventors: Tiharu Kato; Hatsuo Nakamura, both of Yokohama; Shigeo Koguchi, Tokyo; Toshio Yonezawa, Yokosuka; Toshihiro Abe, Kawasaki, all of Japan

[73] Assignee: Tokyo Shibaura Denki Kabushiki Kaisha, Japan

[21] Appl. No.: 534,938

[22] Filed: Sep. 26, 1983

Related U.S. Application Data

[63] Continuation of Ser. No. 374,064, May 3, 1982, abandoned.

[30] Foreign Application Priority Data

May 7, 1981 [JP] Japan .................................. 56-67658

[51] Int. Cl.³ ........................ G03C 1/495; G03C 1/76
[52] U.S. Cl. .................................... 430/273; 430/271; 430/317; 430/327; 430/523; 430/531; 430/961
[58] Field of Search .............. 430/271, 273, 961, 311, 430/316, 325, 326, 317, 523, 327

[56] References Cited

U.S. PATENT DOCUMENTS

| | | | |
|---|---|---|---|
| 3,458,311 | 7/1969 | Alles | 430/273 |
| 3,652,273 | 3/1972 | Htoo | 430/325 |
| 4,335,173 | 6/1982 | Caraballo | 428/65 |

FOREIGN PATENT DOCUMENTS 2026346  2/1980  United Kingdom ................ 430/531

Primary Examiner—John E. Kittle
Assistant Examiner—José G. Dees
Attorney, Agent, or Firm—Finnegan, Henderson, Farabow, Garrett & Dunner

[57] ABSTRACT

An improved method of forming a photoresist pattern in the photoengraving process. In the photoengraving process, after forming a photoresist layer, a non-photosensitive organic layer containing cyclized polyisoprene rubber as the major constituent is formed thereover. The organic layer is covered with a mask. The photoresist layer is selectively exposed to light through the organic layer. After developing and removing the organic layer, or together with the organic layer, the photoresist layer is developed.

14 Claims, 12 Drawing Figures

F I G. 2
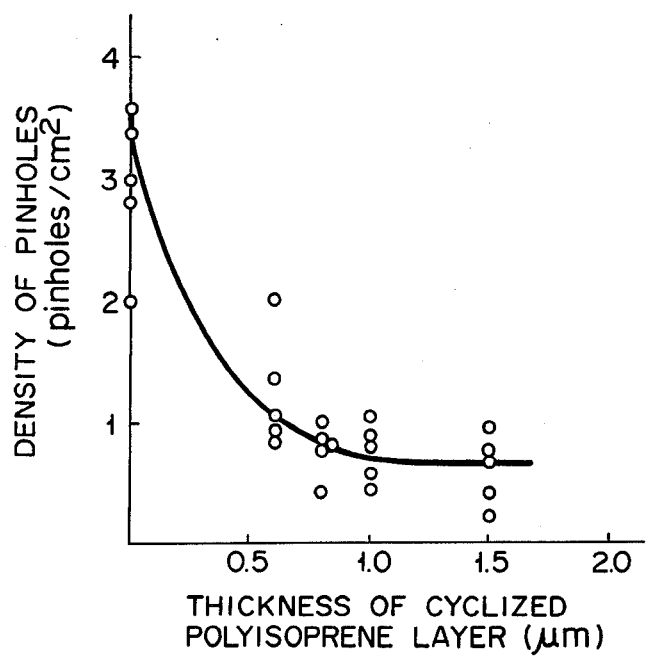
F I G. 3
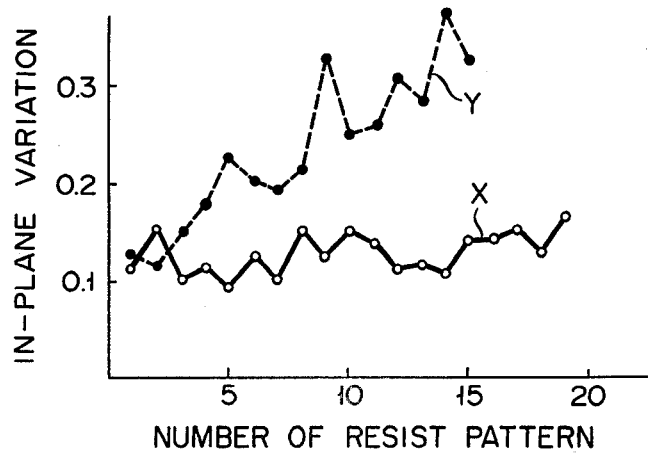

F I G. 4
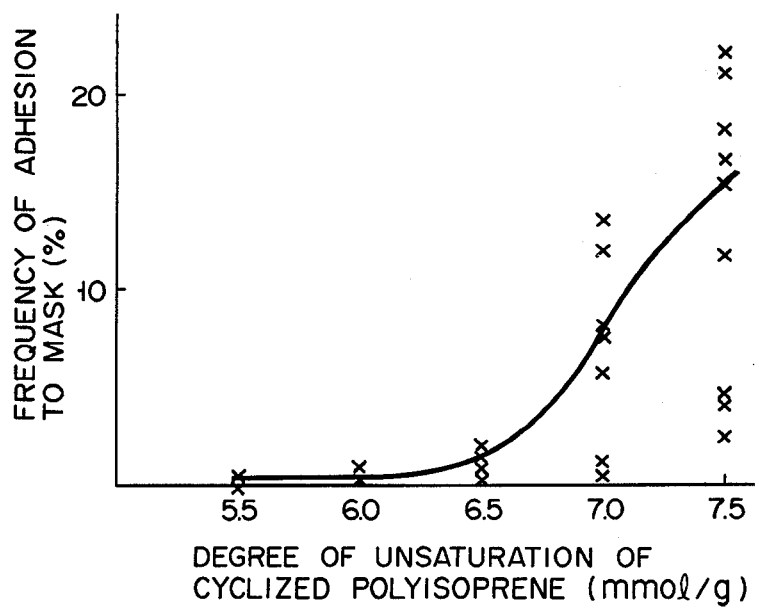
F I G. 5
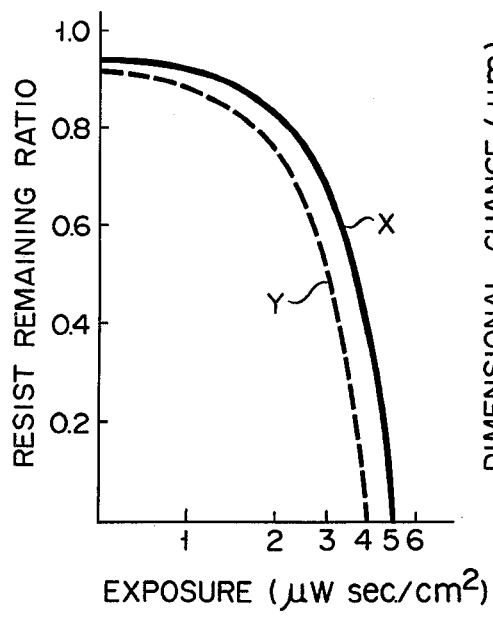
F I G. 6
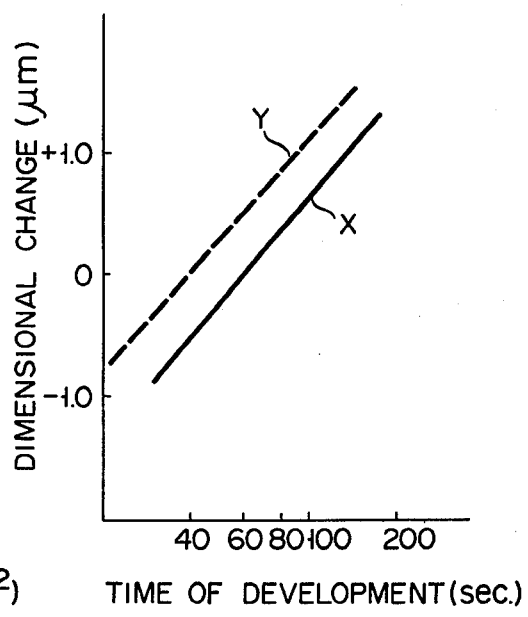

METHOD FOR FORMING RESIST PATTERN

This application is a continuation of application Ser. No. 374,064, filed May 3, 1982, now abandoned.

BACKGROUND OF THE INVENTION

1. Field of the Invention

The present invention relates to a photoengraving process used in a method for manufacturing a semiconductor device. More particularly, the present invention relates to a method for forming a desired photoresist pattern in photoengraving process.

2. Description of the Prior Art

The photograving process is well known as a method for forming an impurity region of a desired pattern on the surface of a semiconductor substrate. Such a photoengraving process includes steps of forming a photoresist layer on a semiconductor substrate (on $SiO_2$ layer) consisting of a semiconductor layer and a silicon oxide layer, covering the photoresist layer with a mask having a pattern corresponding to the pattern of the impurity region to be formed, and radiating the photoresist layer of the substrate with light by an aligner through the mask. When the photoresist layer is developed later, only the exposed part of the photoresist layer dissolves (in the case of a positive resist) or the non-exposed part of the photoresist layer dissolves (in the case of a negative resist), thus forming a photoresist region of desired pattern. Using this photoresist region as a mask, the silicon oxide film exposed therethrough is etched by hydrofluoric acid or the like to thereby expose the semiconductor layer. An impurity is then doped into the exposed semiconductor layer by ion diffusion or the like. In this manner, a semiconductor substrate having an impurity region of desired pattern is obtained.

However, defects are caused during masking in the photoengraving process or during covering the photoresist layer with the mask. Mechanism of formation of such defects is significantly related with the exposing method of the aligner and the brittleness of the photoresist layer. Formation of defects is especially notable when a positive resist of phenol novolak type is subjected to contact exposure (exposure is performed with the mask and the resist layer being in contact with each other). This has presented restrictions on the micronization of semiconductor elements, high packaging density, and patterning reliability.

In order to prevent formation of resist defects attributable to the brittleness of the photoresist layer, it has recently been proposed to coat the photoresist layer with a material having the property of an overcoating agent such as polyvinyl alcohol (PVA) or hydroxypropyl cellulose (HPC). Both PVA and HPC are soluble in water and alkalis and are relatively effective for preventing formation of the resist defects as described above. However, this method has not been put into practice due to the drawbacks to be described later.

When the photoresist layer is coated with PVA, (1) nitrogen gas produced by exposure is trapped between the PVA and the resist layer since PVA does not allow easy permeation of nitrogen gas. (2) For this reason, patterning becomes irregular. (3) PVA generally contains sodium which adversely affects the operation of the semiconductor element. (4) If PVA is stored in a bottle, the PVA may become turbid or gelled by the action of bacteria. When such PVA is coated, the coating characteristics are degraded and light dispersion occurs.

On the other hand, if HPC is coated on the photoresist layer, (1) HPC easily reacts with the photoresist layer upon exposure. (2) For this reason, the edge of the resist pattern becomes non-uniform, so that dimension control of the pattern is impaired. (3) HPC is also prepared using sodium as a catalyst as in the case of PVA and thus contains a relatively great amount of sodium. This makes the HPC high in cost.

SUMMARY OF THE INVENTION

It is an object of the present invention to provide a method of forming a resist pattern by the photoengraving process, wherein defects may not be caused due to the brittleness of the photoresist layer.

It is another object of the present invention to provide a method of forming a fine resist pattern with high precision and reproducibility.

It is still another object of the present invention to provide a method of forming a resist pattern wherein the service life of a mask used for the photoengraving process may be prolonged.

In order to achieve the above and other objects of the present invention, there is provided according to the present invention a method of forming a photoresist pattern on a semiconductor substrate in a photoengraving process, which comprises the steps of:

forming a photoresist layer on one major surface of the semiconductor substrate;

forming, on said photoresist layer, a non-photosensitive organic layer containing cyclized polyisoprene rubber as a major constituent, said cyclized polyisoprene having a degree of unsaturation of about 5.5 to about 7.5 mmol/g;

selectively exposing said photoresist layer through said organic layer by placing a photomask in contact with the organic layer;

developing said organic layer with a first developer containing a surface-active agent to remove said organic layer; and developing said photoresist layer with a second developer.

BRIEF DESCRIPTION OF THE DRAWINGS

FIG. 2 is a graph showing the relation between the thickness of an organic layer containing cyclized polyisoprene rubber as a major constituent and the density of the pinholes formed in the photoresist layer;

FIG. 3 is a graph showing the relation between the number of times the same mask is used and in-plane variations of the photoresist pattern when the organic layer containing cyclized polyisoprene rubber as the major constituent is used and when it is not used;

FIG. 4 is a graph showing the relation between the degree of unsaturation of the cyclized polyisoprene rubber and the adhesion frequency of the rubber to the mask;

FIG. 5 is a graph showing the relation between the exposure and the remaining ratio of the resist layer when the organic layer containing cyclized polyisoprene rubber as the major constituent is used and when it is not used; and FIG. 6 is a graph showing the relation between the developing time and the dimensional change when the organic layer containing cyclized polyisoprene rubber as the major constituent is used or when it is not used.

DETAILED DESCRIPTION OF THE PREFERRED EMBODIMENTS

The preferred embodiment of the method of the present invention will now be described with reference to FIGS. 1A to 1G.

Figure 1A:
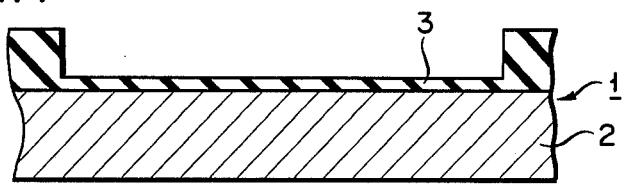
FIGS. 1A to 1G are sectional views for explaining the method according to an embodiment of the present invention.

A semiconductor substrate 1 is prepared (FIG. 1A). The semiconductor substrate 1 consists of a semiconductor layer 2 of silicon or the like and an oxide layer 3 of silicon oxide or the like. The "semiconductor substrate" as used herein means a substrate having at least one semiconductor layer.

Figure 1B:
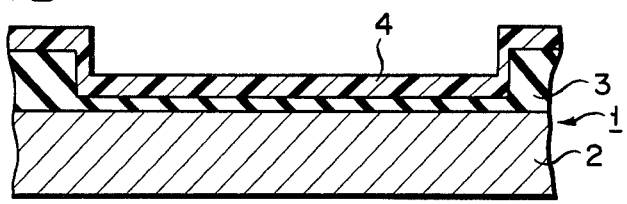

Using a resist coater or the like, the oxide layer 3 is coated with a photoresist of phenol novolak type. Prebaking is performed in an oven to form a photoresist layer 4 (FIG. 1B).

Figure 1C:
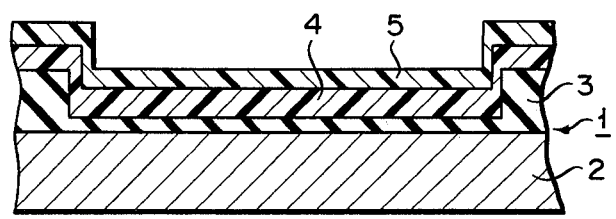

A cyclized polyisoprene rubber solution which does not contain an optical cross-linking agent is coated over the photoresist layer 4 using the resist coater or the like. Second prebaking is performed in the oven to form an organic layer 5 containing cyclized polyisoprene rubber as the major constituent (FIG. 1C). A solvent of the cyclized polyisoprene rubber does not preferably dissolve the photoresist layer 4. If a positive resist is used, examples of such solvent may include aromatic compounds such as xylene, bromobenzene, benzene, monochlorobenzene, dichlorobenzene, and toluene; alicyclic compounds such as methylcyclohexane and kerosene; and trichloroethylene. The "organic layer containing cyclized polyisoprene rubber as the main constituent" used herein means a cyclized polyisoprene rubber layer and a layer consisting essentially of cyclized polyisoprene rubber and the solvent as mentioned above. The cyclized polyisoprene rubber preferably has a molecular weight of 50,000 to 200,000. However, in some cases, cyclized polyisoprene rubber having molecular weight of up to 220,000 may preferably be used. Cyclized polyisoprene rubber having a molecular weight of 100,000 to 200,000 is commercially available at present and this may be conveniently used for the present invention. The degree of unsaturation of cyclized polyisoprene rubber is preferably $6.5 \pm 1.0$ mmol/g and is more preferably $6.0 \pm 0.5$ mmol/g. The temperature and time of the second prebaking must be selected so that the photoresist layer 4 may not be thermally degraded (thermally changed) and most of the solvent of the cyclized polyisoprene rubber solution may be evaporated. For example, the second prebaking may be performed at 85° C. for 10 to 15 minutes. The thickness of the cyclized polyisoprene rubber layer is preferably 0.8 μm or more.

Figure 1D:
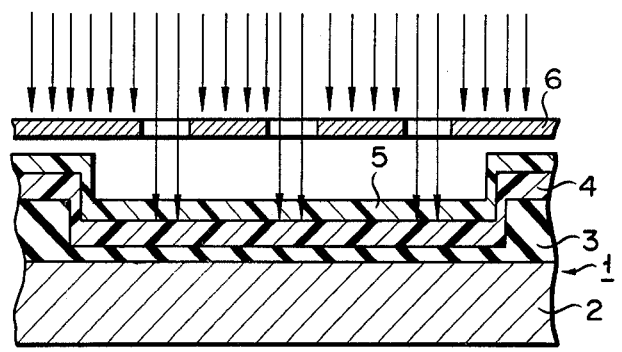

The organic layer 5 is then covered with a mask 6. Using an aligner (not shown), the photoresist layer 4 is selectively exposed through the mask 6 and the organic layer 5 (FIG. 1D). The aligner generally comprises a mercury lamp and the wavelength of light emitted therefrom is generally 300 to 450 nm. Since cyclized polyisoprene rubber transmits light of this wavelength range well, the photoresist layer 4 may be exposed well.

Figure 1E:
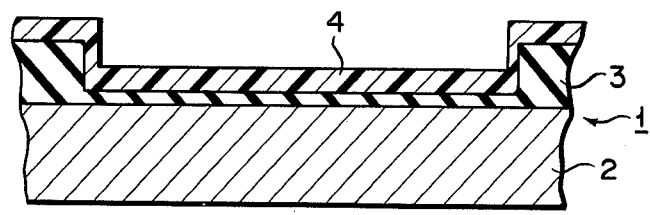

Then, the organic layer 5 is entirely removed by developing (FIG. 1E). For this developing, a developer which does not substantially dissolve the underlying photoresist layer must be used. If a phenol novolak type positive resist is used for the photoresist layer, the developer may be selected from the following examples. Examples of the developer may include aromatic compounds such as xylene, bromobenzene, benzene, monochlorobenzene, dichlorobenzene, and toluene; alicyclic compounds such as methylcyclohexane and kerosene; and trichloroethylene. A surface active agent (e.g., alkylbenzene sulfonate) is added to the developer as mentioned above in the amount of several percents. An anion surface active agent or an non-ion surface active agent may preferably be used. If a negative resist is used for the photoresist layer, a commercially available developer for negative resist such as xylene, n-heptane, trichrene or the like may be used. If such a developer is used, the overcoat is removed and at the same time the non-cross-linked part of the underlying negative resist is patterned.

Figure 1F:
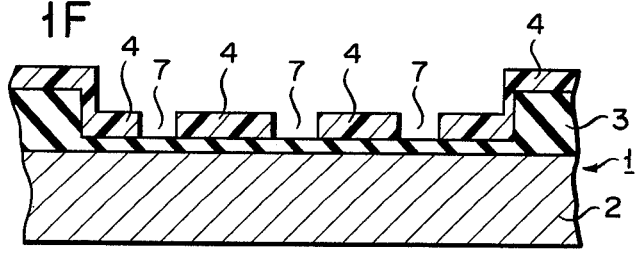

The photoresist layer 4 is then developed (FIG. 1F). This developing step may be performed in the same manner as in the conventional photoengraving process. If the phenol novolak type positive resist is used, a developer may be xylene, for example. A resist pattern with openings 7 is thus obtained.

Figure 1G:
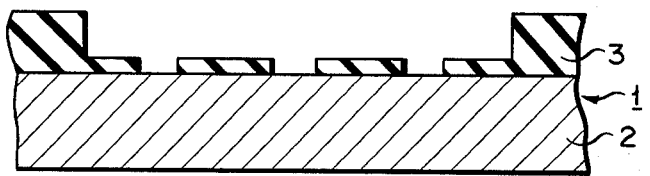

Postbaking is then performed. The part which is not covered with the photoresist layer 4 is etched by hydrofluoric acid using this photoresist layer as a mask, and then the photoresist layer 4 is eliminated (FIG. 1G). This may be performed in the same manner as in the conventional photoengraving process. In this manner, the semiconductor substrate 1 of a desired pattern is obtained.

If a negative resist such as OMR-83 (trade name; Tokyo Oyo Kagaku K.K.) is used as the photoresist layer 4, the developing step of the organic layer 5 and that of the photoresist layer 4 may be performed within a single step. This is because these developing steps may be performed by using the same developer such as n-heptane.

EXAMPLE 1

Cyclized polyisoprene rubber-type organic layers of various thicknesses were formed. The density of the pinholes (pinholes/cm$^2$) formed in the photoresist layer after masking was measured for each sample. The photoresist used was a positive resist of phenol novolak type and had a thickness of 1.5 μm. The obtained results are shown in FIG. 2. Referring to the graph of FIG. 2, where the thickness of the organic layer is 0 μm, it means that the cyclized polyisoprene rubber layer is not formed. It is seen from this graph that the density of the pinholes formed in the photoresist layer depends upon the thickness of the organic layer. If the thickness of the organic layer is 0.8 μm or more, the density of the pinholes formed in the photoresist layer is reduced to ⅓ to 1/5 that in the case wherein the organic layer was not formed at all.

EXAMPLE 2

In-plane variations (1σ value) of the photoresist pattern were measured when a number of photoresist patterns were formed using the same mask. The measurement was performed in the manner described below. The inplane variations mean the standard deviation of the size of the formed photoresist pattern.

A positive resist of phenol novolak type (OFPR2: trade name, Tokyo Oyo Kagaku K.K.) was formed to a thickness of 1 μm on a substrate in a conventional manner. A cyclized polyisoprene rubber solution was coated thereover using xylene as a solvent. Prebaking was performed at a temperature of 85° C. for 10 minutes to form an organic layer of cyclized polyisoprene rubber of 1 μm thickness. After masking, the structure was exposed to light at 300 μW/cm² for 20 seconds using an aligner. Then, a developer consisting of xylene and 1% alkylbenzenesulfonate was sprayed over the organic layer for developing over a period of 20 seconds. The organic layer was then entirely removed. After drying, the photoresist layer was developed over a period of 60 seconds using an ammonium salt-type developer (TM2: trade name; Tama Kagakusha) according to the conventional method. The photoresist layer was thus patterned.

Using the same mask, a second photoresist layer on a second wafer was exposed and developed under the same conditions as described above. Using the same mask, a third photoresist layer on a third wafer was exposed and developed under the same conditions. Similarly, up to 19 photoresist layers on separate wafers were exposed and developed under the same conditions using the same mask.

For the purpose of comparison, 15 photoresist patterns were formed on separate wafers under the same conditions as described above except that the cyclized polyisoprene rubber-type organic layers were not formed.

The obtained results are shown in FIG. 3. Referring to FIG. 3, the number of the resist patterns formed is plotted as the abscissa (1 is assigned for the first photoresist pattern on the first wafer, and 10 is assigned for the tenth photoresist pattern on the tenth wafer). The in-plane variations are plotted as the ordinate. Referring to the graph of FIG. 3, curve X represents the case wherein the cyclized polyisoprene rubber-type organic layer was formed, and curve Y represents the case wherein the organic layer was not formed. As may be seen from this graph, if the cyclized polyisoprene rubber-type organic layer is not formed, the in-plane variations of the photoresist pattern increase as the number of times that the mask is used increases. In contrast to this, if the organic layer is formed, the in-plane variations of the photoresist pattern do not substantially increase even if a number of photoresist patterns are formed using the same mask. As described above, according to the conventional method which does not involve formation of the cyclized polyisoprene rubber-type organic layer, the in-plane variations of the photoresist pattern increase if the same mask is used repeatedly. This is mainly attributable to the brittleness of the photoresist to the mask. When this occurs, if a fine pattern of about 2 μm width is formed, the pattern becomes partially continuous. On the other hand, if the cyclized polyisoprene rubber-type organic layer is used as an overcoat, the degree of unsaturation of cyclized polyisoprene rubber may be made relatively small. Then, the organic layer does not substantially adhere to the mask during masking and exposure. Moreover, the organic layer provides cushion effect in the case of masking, thus preventing damage to the underlying photoresist layer due to the impact of masking. For this reason, the mask is not contaminated. Therefore, even if the mask is used repeatedly, the in-plane variations of the photoresist pattern do not substantially increase. Thus, a fine pattern of about 2 μm width may be formed with good precision.

EXAMPLE 3

Using cyclized polyisoprene rubbers of various degrees of unsaturation, the relation between the degree of unsaturation of cyclized polyisoprene rubber and the frequency of adhesion of the rubber to the mask was examined. The frequency of adhesion of the rubber to the mask represents the frequency in % of the adhesion of the cyclized polyisoprene rubber-type organic layer adhered to the mask when the mask is removed after masking. The solvent for the rubber, thickness of the organic layer and the prebaking conditions were the same as in Example 2.

The degree of unsaturation was measured by mixing a suitable amount of cyclized polyisoprene rubber with a mixture of equal amounts of m-chlorobenzoic acid and benzene. After adding a sufficient amount of potassium iodide, sodium thiosulfate titration was performed. The degree of unsaturation or the number of double bonds (mmol/g) is expressed by the following relation:

$$D = NFA/2WS$$

wherein D = degree of unsaturation (mmol/g),
N = normality of sodium thiosulfate,
A = titrimetric amount (ml),
W = weight (g) of cyclized polyisoprene,
S = solid content The obtained results are shown in FIG. 4. It is seen from this graph that the frequency of adhesion of the rubber to the mask increases when the degree of unsaturation of cyclized polyisoprene rubber exceeds 6.5 mmol/g. Therefore, the degree of unsaturation of the rubber is preferably within the range of $6.0 \pm 0.5$ mmol/g. However, if the degree of unsaturation is within the range of $6.5 \pm 1.0$ mmol/g, the photoresist pattern may be mass-produced without practical problems.

EXAMPLE 4

The effects of the formation of the cyclized polyisoprene rubber-type organic layer on the remaining ratio of the photoresist layer were examined. The remaining ratio of the photoresist layer is a ratio of the thickness of the photoresist layer after exposure and developing to that after prebaking. Thus, if the remaining ratio is 0, it means that the photoresist layer is completely removed.

The photoresist layers were exposed and developed in the same manner as in Example 2 except that the exposure was varied. The obtained results are shown in FIG. 5. Curve X represents the case wherein the cyclized polyisoprene rubber-type organic layer was formed as an overcoat, and curve Y represents the case wherein the organic layer was not formed. It is seen from this graph that the exposure must be slightly increased in order to achieve the same remaining ratio if the organic layer is formed as compared to the case wherein the organic layer is not formed. The rate of increase of the exposure depends upon the kind of the developer used for developing the cyclized polyisoprene rubber-type organic layer. This phenomenon is considered to be attributable to the fact that the solvent of cyclized polyisoprene rubber is dispersed in the surface layer of the underlying photoresist layer to harden the photoresist layer.

EXAMPLE 5

The relation between the developing time of the photoresist layer and the dimensional change was examined. The dimensional change means the difference between the mask size and the photoresist pattern size.

The photoresist patterns were formed in the same manner as in Example 2 except that the developing time of the photoresist layer was varied.

The obtained results are shown in FIG. 6. Curve X represents the case wherein the cyclized polyisoprene rubber-type organic layer was formed, and curve Y represents the case wherein the organic layer was not formed. It is seen from this graph that the developing time to achieve zero dimensional change increases if the organic layer is formed. However, even if the organic layer is formed, the patterning control may be satisfactorily performed if the developing time is prolonged. If the developing time increases excessively by the use of the organic layer, the concentration of the developer used may be increased.

According to the present invention, the formation of defects which are caused due to the brittleness of the photoresist layer may be effectively prevented, and uniform and fine patterns may be formed with good precision. Furthermore, mass-production of fine patterns of about 1 μm width which has hitherto been impossible may be performed with satisfactory reliability. Moreover, the service life of the mask is prolonged. Since the wafer defects are effectively eliminated according to the present invention, the yield of element manufacture may be improved.

As an additional advantage of the present invention, since the surface layer of the photoresist layer is hardened by the solvent of the cyclized polyisoprene rubber, the remaining ratio of the unexposed part of the photoresist layer may be increased. Accordingly, the edge of the pattern formed becomes sharp, resulting in high contrast.

What we claim is:

1. A method of forming a photoresist pattern on a semiconductor substrate in a photo-engraving process, which comprises the steps of:
    forming a positive photoresist layer on one major surface of the semiconductor substrate;
    forming, on said photoresist layer, a non-photosensitive organic layer containing cyclized polyisoprene rubber as a major constituent, said cyclized polyisoprene having a degree of unsaturation of about 5.5 to about 7.5 mmol/g;
    selectively exposing said photoresist layer through said organic layer through a photomask placed in contact with said organic layer;
    developing said non-photosensitive organic layer with a first developer containing a surface-active agent to remove said organic layer; and
    developing said photoresist layer with a second developer.

2. The method according to claim 1 wherein said surface-active agent is alkylbenzene sulfonate.

3. The method according to claim 2 wherein the amount of alkylbenzene sulfonate present is approximately 1%.

4. The method according to claim 1, wherein the degree of unsaturation is 6.0±0.5 mmol/g.

5. The method according to claim 1, wherein said organic layer containing cyclized polyisoprene rubber as the major constituent has a thickness of not less than about 0.8 μm.

6. The method according to claim 1, wherein said cyclized polyisoprene rubber has a molecular weight of 50,000 to 200,000.

7. The method according to claim 1, wherein said positive resist layer is a phenol novolak-type positive resist layer.

8. The method according to claim 1, wherein said step of forming, on said photoresist layer, said organic layer containing cyclized polyisoprene rubber as the major constituent comprises coating said photoresist layer with a cyclized polyisoprene rubber solution and drying the coated layer of the solution.

9. The method according to claim 8, wherein the solvent of said cyclized polyisoprene solution is (a) an aromatic compounds selected from the group consisting of xylene, toluene, benzene, monochlorobenzene, dichlorobenzene, and bromobenzene; (b) an alicyclic compounds selected from the group consisting of methylcyclohexane and kerosene; or (c) trichloroethylene.

10. The method according to claim 1, wherein said organic layer containing cyclized polyisoprene rubber as the major constituent essentially consists of cyclized polyisoprene rubber.

11. The method according to claim 8, wherein said organic layer containing cyclized polyisoprene rubber as the major constituent consists of cyclized polyisoprene rubber and the solvent of cyclized polyisoprene rubber.

12. The method according to claim 1, wherein said first developer is (a) an aromatic compounds selected from the group consisting of xylene, toluene, benzene, monochlorobenzene, dichlorobenzene, and bromobenzene; (b) an alicyclic compounds selected from the group consisting of methylcyclohexane and kerosene; or (c) trichloroethylene.

13. The method according to claim 1, wherein said surface-active agent is; an anionic surface active agent.

14. The method according to claim 1, wherein said surface-active agent is a non-ionic surface active agent.

* * * * *